United States Patent
Stewart et al.

(10) Patent No.: US 7,680,160 B2
(45) Date of Patent: Mar. 16, 2010

(54) CONTROL CIRCUIT FOR OPTOELECTRONIC MODULE WITH INTEGRATED TEMPERATURE CONTROL

(75) Inventors: James Stewart, Burlingame, CA (US); Anthony Ho, Sunnyvale, CA (US); Andreas Weber, Los Altos, CA (US); Lucy G. Hosking, Santa Cruz, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/851,316

(22) Filed: Sep. 6, 2007

(65) Prior Publication Data
US 2007/0297468 A1    Dec. 27, 2007

Related U.S. Application Data

(62) Division of application No. 10/101,248, filed on Mar. 18, 2002, now Pat. No. 7,269,191.

(60) Provisional application No. 60/357,073, filed on Feb. 12, 2002.

(51) Int. Cl.
*H01S 3/00* (2006.01)
(52) U.S. Cl. .......................... 372/33; 372/34
(58) Field of Classification Search .......... 372/33, 372/34
See application file for complete search history.

(56) References Cited

U.S. PATENT DOCUMENTS

| 4,631,728 | A | 12/1986 | Simons |
| 5,024,535 | A | 6/1991 | Winston, Jr. |
| 5,438,579 | A | 8/1995 | Eda et al. |
| 5,604,758 | A | 2/1997 | AuYeung et al. |
| 5,960,135 | A | 9/1999 | Ozawa |
| 6,400,737 | B1 | 6/2002 | Broutin et al. |
| 6,580,531 | B1 | 6/2003 | Swanson et al. |
| 2002/0141461 | A1* | 10/2002 | Liu ......................... 372/29.01 |

FOREIGN PATENT DOCUMENTS

EP    0822676    2/1998

\* cited by examiner

*Primary Examiner*—Dung T Nguyen
(74) *Attorney, Agent, or Firm*—Workman Nydegger

(57) ABSTRACT

A microprocessor is used to control the temperature of a laser emitter and thereby regulate the wavelength of optical signals from the laser. A serial interface in the microprocessor provides input and output lines to a host device, and temperature lookup tables are stored in nonvolatile memory. Control logic processes information stored in the memory as well as information on operating conditions of the laser emitter to precisely control the temperature of the laser emitter. A thermoelectric cooler adjusts the temperature of the laser emitter.

9 Claims, 13 Drawing Sheets

Ambient Temperature Lookup Table 300

| Ambient Temp. | Change in $V_{ref}$ |
|---|---|
| -10 °C | 0.50 volts |
| 0 °C | 0.38 volts |
| 10 °C | 0.27 volts |
| 20 °C | 0.15 volts |
| 30 °C | 0.03 volts |
| 40 °C | -0.08 volts |
| 50 °C | -0.12 volts |
| 60 °C | -0.32 volts |
| 70 °C | -0.43 volts |
| 80 °C | -0.55 volts |

Lookup Table 600

| Ambient Temp. | Change in Duty Factor |
|---|---|
| -10° C | -15 % |
| 0 ° C | -10 % |
| 10 ° C | -5 % |
| 20 ° C | 0 |
| 30 ° C | 5 % |
| 40 ° C | 10 % |
| 50 ° C | 15 % |
| 60 ° C | 25 % |
| 70 ° C | 35 % |
| 80° C | 50 % |

CONTROL CIRCUIT FOR OPTOELECTRONIC MODULE WITH INTEGRATED TEMPERATURE CONTROL

CROSS-REFERENCE TO RELATED APPLICATIONS

This application is a divisional, and claims the benefit, of U.S. patent application Ser. No. 10/101,248, entitled CONTROL CIRCUIT FOR OPTOELECTRONIC MODULE WITH INTEGRATED TEMPERATURE CONTROL, filed Mar. 18, 2002, which, in turn, claims the benefit U.S. Provisional Patent Application No. 60/357,073, filed December Feb. 12, 2002. The present application is related to U.S. Pat. No. 6,868,104 entitled COMPACT LASER PACKAGE WITH INTEGRATED TEMPERATURE CONTROL and U.S. Pat. No. 6,880,983 entitled OPTOELECTRONIC MODULE WITH THERMALLY ISOLATED COMPONENTS. All of the foregoing patent applications are incorporated herein in their respective entireties by this reference.

BACKGROUND OF THE INVENTION

1. The Field of the Invention

The present invention relates generally to optoelectronic components. More particularly, the present invention relates to circuitry for controlling the temperature of a laser emitter.

2. The Relevant Technology

FIG. 1 shows a schematic representation of the essential features of a typical prior-art fiber optic transceiver. The main circuit 1 contains at a minimum transmit and receiver circuit paths and power 19 and ground connections 18. The receiver circuit typically consists of a Receiver Optical Subassembly (ROSA) 2 which contains a mechanical fiber receptacle and coupling optics as well as a photodiode and pre-amplifier (preamp) circuit. The ROSA is in turn connected to a post-amplifier (postamp) integrated circuit 4, the function of which is to generate a fixed output swing digital signal which is connected to outside circuitry via the RX+ and RX− pins 17. The postamp circuit also often provides a digital output signal known as Signal Detect or Loss of Signal indicating the presence or absence of suitably strong optical input. The Signal Detect output is provided as an output on pin 20. The transmit circuit will typically consist of a Transmitter Optical Subassembly (TOSA), 3 and a laser driver integrated circuit 5. The TOSA contains a mechanical fiber receptacle and coupling optics, as well as a laser diode or LED. The laser driver circuit will typically provide AC drive and DC bias current to the laser. The signal inputs for the AC driver are obtained from the TX+ and TX− pins 12. Typically, the laser driver circuitry will require individual factory setup of certain parameters such as the bias current (or output power) level and AC modulation drive to the laser. This is frequently accomplished by adjusting variable resistors or placing factory selected resistors 7, 9 (i.e., having factory selected resistance values). Additionally, temperature compensation of the bias current and modulation is often required. This function can be integrated in the laser driver integrated circuit or accomplished through the use of external temperature sensitive elements such as thermistors 6, 8.

In addition to the most basic functions described above, some transceiver platform standards involve additional functionality. Examples of this are the TX disable 13 and TX fault 14 pins described in the GBIC (Gigabit Interface Converter) standard. In the GBIC standard (SFF-8053), the TX disable pin 13 allows the transmitter to be shut off by the host device, while the TX fault pin 14 is an indicator to the host device of some fault condition existing in the laser or associated laser driver circuit. In addition to this basic description, the GBIC standard includes a series of timing diagrams describing how these controls function and interact with each other to implement reset operations and other actions. Most of this functionality is aimed at preventing non-eyesafe emission levels when a fault condition exists in the laser circuit. These functions may be integrated into the laser driver circuit itself or in an optional additional integrated circuit 11. Finally, the GBIC standard for a Module Definition "4" GBIC also requires the EEPROM 10 to store standardized serial ID information that can be read out via a serial interface (defined as using the serial interface of the ATMEL AT24CO1A family of EEPROM products) consisting of a clock 15 and data 16 line.

In the above referenced patent applications entitled "Compact Laser Package With Integrated Temperature Control" and "Optoelectronic Module with Thermally Isolated Components," temperature controllers are integrated within an optoelectronic module and/or a laser package itself It is difficult to implement the temperature control functionality for such controllers using the prior art control circuitry.

Accordingly, circuitry for controlling temperature regulators of an optoelectronic device is needed.

BRIEF SUMMARY OF THE INVENTION

An embodiment of the present invention is an optoelectronic assembly having an internal temperature controller and an internal microprocessor. In this embodiment, the microprocessor includes a two wire serial interface for coupling to a host device, nonvolatile memory for storing temperature lookup tables, and control logic to process information stored in the memory, as well as information on operating conditions of the laser emitter. Output from the microprocessor controls a driver for the internal temperature controller, which regulates the temperature of the laser emitter. In furtherance of the present invention, the microprocessor is programmable. Thus, a variety of temperature control algorithms can be implemented by the microprocessor.

In one embodiment, the present invention is directed to an optoelectronic transceiver or an optoelectronic transmitter. A laser emitter, a laser driver, a laser temperature sensor, a temperature control mechanism for the laser emitter, and a microprocessor for setting an operating parameter for the temperature control mechanism are contained within a housing. The microprocessor includes nonvolatile memory for storing information relating to the laser emitter and an interface for reading and writing digital values to and from locations in the memory. This information may include lookup tables, such as an ambient temperature lookup table. The microprocessor also includes analog to digital conversion circuitry to convert analog signals it receives from the laser driver and sensors in the optoelectronic device into digital values for storage in the memory. The signals may include a voltage corresponding to the bias current from the laser driver and signals from an ambient temperature sensor. In addition, the microprocessor includes logic for determining a reference voltage value associated with a target temperature for the laser emitter based on the lookup tables and other digital values stored in the memory. The microprocessor also includes digital to analog conversion circuitry for converting the reference voltage value to a reference voltage, which is then provided to the temperature control mechanism. The temperature control mechanism causes the temperature of the laser emitter to reach a target value in response to the reference voltage provided by the microprocessor. The temperature control mechanism includes a thermo-electric cooler (TEC), a TEC driver and a TEC controller.

In furtherance of another embodiment of the invention, the microprocessor includes logic to generate a temperature control value associated with a target temperature for the laser emitter and a digital to analog converter to convert the temperature control value to an analog control signal and provide the analog control signal to a temperature control mechanism. The logic generates the temperature control value based on lookup tables and other digital values stored in memory. The temperature control mechanism causes the temperature of the laser emitter to reach a target value in response to the analog control signal and a reference voltage. In this aspect of the invention, the temperature control mechanism includes a thermo-electric cooler (TEC) and a TEC driver. A proportional integral differential controller and a filter may be used in place of the digital to analog converter. The proportional integral differential controller generates a pulse width modulated signal having a pulse width corresponding to the temperature control value. The filter converts the pulse width modulated signal to a DC control voltage, and the DC control voltage is supplied to the temperature control mechanism.

In yet another embodiment, the present invention provides a method for controlling an optoelectronic transceiver or an optoelectronic transmitter. The method includes calibrating a laser emitter in an optoelectronic transceiver or an optoelectronic transmitter by monitoring the wavelength of optical signals from the laser emitter while varying its temperature as well as other operating conditions, and then storing calibration information in the memory of a microprocessor. The method also includes receiving analog signals from the laser emitter and sensors in the optoelectronic device and converting the analog signals into digital values, which are also stored in the memory. Finally, the method includes generating control signals based on the digital values in the microprocessor to control the temperature of the laser emitter.

These and other objects and features of the present invention will become more fully apparent from the following description and appended claims, or may be learned by the practice of the invention as set forth hereinafter.

BRIEF DESCRIPTION OF THE DRAWINGS

For a better understanding of the invention, reference should be made to the following detailed description taken in conjunction with the accompanying drawings, in which.

DETAILED DESCRIPTION OF THE PREFERRED EMBODIMENTS

Preferred embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
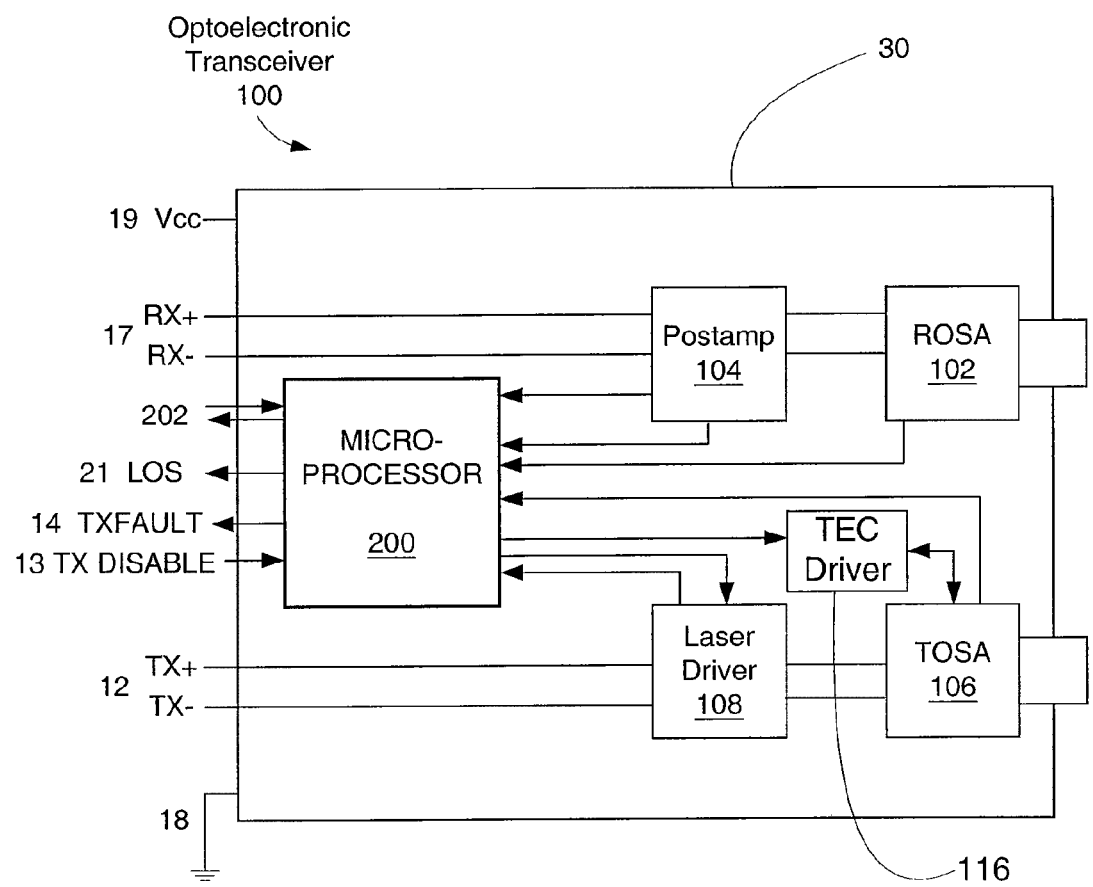
FIG. 2 is a block diagram of an optoelectronic transceiver in accordance with one embodiment of the present invention.

FIG. 2 shows a schematic representation of a fiber optic transceiver 100 in accordance with an embodiment of the present invention. Transceiver 100 includes a Receiver Optical Subassembly (ROSA) 102, which contains a mechanical fiber receptacle and coupling optics, as well as a photodiode and a pre-amplifier (preamp) circuit. ROSA 102 is in turn connected to a post-amplifier (postamp) integrated circuit 104, the function of which is to take relatively small signals from ROSA 102 and amplify and limit them to create a uniform amplitude digital electronic output. The postamp circuit 104 provides a digital output signal known as Signal Detect or Loss of Signal indicating the presence or absence of suitably strong optical input. All the components of the transceiver 100 are preferably located in a protective housing 30, except for connectors that may protrude from the housing. Suitable housings, including metallic, plastic, potting box and other housing structures are well known in the art. In one embodiment, the protective housing 30 are as follows: width, 3 cm or less; length, 6.5 cm or less, and height, 1.2 cm or less. A GBIC standard (SFF-8053 GBIC standard version 5.5) requires the dimensions of a module housing to be approximately 3 cm×6.5 cm×1.2 cm. Thus, the protective housing 30 of this embodiment meets the form factor requirements of the GBIC standard. In another embodiment, the physical dimensions of the module housing are: width, 0.54 inches or less; length, 2.24 inches or less; and height, 0.34 inches or less. The SFP MSA (Small Form Factor Pluggable Multisource Agreement) requires the dimensions of a compliant module housing to be approximately 0.54"×2.24"×0.34". Thus, the module housing in that embodiment meets the form factor requirements of the SFP standard. Note that the present invention is not limited to the form factor requirements described above. A person of ordinary skill in the art having the benefit of this disclosure will appreciate that the present invention is adaptable to various existing or yet to be determined form factors, some of which can be smaller.

The transmit circuitry of transceiver 100 consists of a Transmitter Optical Subassembly (TOSA) 106 and a laser driver integrated circuit 108. TOSA 106 contains a mechanical fiber receptacle and coupling optics, as well as a thermoelectric cooler (TEC) and a laser diode or LED. The laser driver circuit 108 provides AC drive and DC bias current to the laser. The signal inputs for the driver are obtained from I/O pins (not shown) of transceiver 100. In other embodiments, the TEC is external to the TOSA 106. In yet other embodiments, the TEC is integrated within a laser transistor-outline (TO) package.

In addition, the optoelectronic transceiver 100 includes a thermo-electric cooler (TEC) driver 116 and additional circuitry that is not shown for controlling the temperature 30 of the TOSA 106. An embodiment of the TEC driver 116 and the additional circuitry is described in greater detail below in connection with FIGS. 3 and 6.

Also shown in FIG. 2 is microprocessor 200 configured for controlling the operations of the transceiver 100. Suitable microprocessors include the PIC16F870 and PIC16F871 8-bit CMOS FLASH microcontrollers manufactured by Microchip Technology, Inc. Microprocessor 200 is coupled to provide control signals to the post-amplifier 104 and laser driver 108, and these components and the ROSA 102 and TOSA 106 provide feedback signals back to the microprocessor 200. For example, microprocessor 200 provides signals to control the bias current level and AC modulation of laser driver circuit 108, while post-amplifier circuit 104 provides a Signal Detect output to microprocessor 200 to indicate the presence or absence of a suitably strong optical input. Temperature and/or other physical conditions of various components of transceiver 100 may be acquired using sensors that are coupled to microprocessor 200. In some embodiments, conditions of the optical links may also be acquired using the sensors.

In addition to, and sometimes in conjunction with these control functions, there are a number of other tasks that may be handled by microprocessor 200. These tasks include, but are not necessarily limited to, the following:

Setup functions. These generally relate to the required adjustments made on a part-to-part basis in the factory to allow for variations in component characteristics such as laser diode threshold current.

Identification. This refers to the storage of an identity code within a general purpose memory (e.g., an EEPROM). Additional information, such as sub-component revisions and factory test data, may also be stored within the general purpose memory for purposes of identification.

Eye safety and general fault detection. These functions are used to identify abnormal and potentially unsafe operating parameters and to report these to the host device and/or perform laser shutdown, as appropriate. Sensors may be used to identify such abnormal or potentially unsafe operating parameters.

Receiver input optical power measurement. This function is used to measure the input optical power and a report of this measurement may be stored in the memory.

Laser diode drive current. This function is used to set the output optical power level of the laser diode.

Laser diode temperature monitoring and control. In one embodiment of the present invention, a temperature controller (e.g., a thermal-electric cooler) is disposed in or near TOSA 106 for controlling the temperature of the laser emitter therein. In this embodiment, microprocessor 200 is responsible for providing control signals to the temperature controller.

Note that transceiver 100 has a serial interface 202 for communicating with a host device. As used herein, a host device refers to a link card to which a transceiver is attached and/or a host system computer to which a transceiver provides an optical connection. Host systems may be computer systems, network attached storage (NAS) devices, storage area network (SAN) devices, optoelectronic routers, as well as other types of host systems and devices.

In some embodiments the optoelectronic transceiver 100 includes an integrated circuit controller that may perform some of the functions listed above. For example, an integrated circuit controller performs the tasks of identification and eye safety and general fault detection, while the microprocessor provides control signals to the temperature controller and also may perform other tasks.

Figure 3:
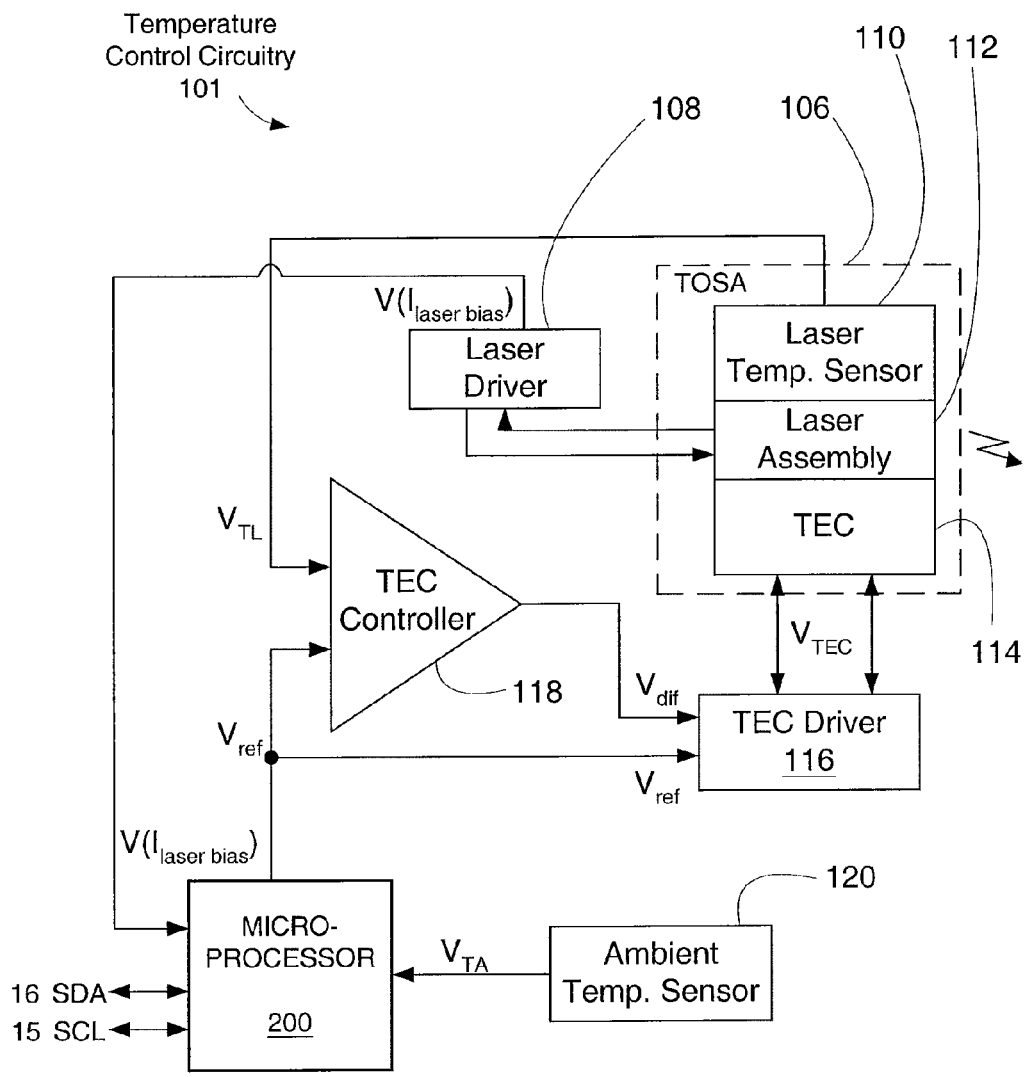
FIG. 3 is a block diagram illustrating circuitry for controlling the temperature of a laser emitter in accordance with one embodiment of the present invention.

FIG. 3 illustrates a portion of a temperature control circuitry 101 of the transceiver 100 according to one embodiment of the present invention. The temperature control circuitry 101 is coupled to a TOSA 106. In some embodiments, TOSA 106 includes a laser assembly 112 (e.g., a laser transistor outline package), which in turn includes a laser emitter (e.g., an edge emitting laser diode) that is activated when a positive bias current $I_{laser\ bias}$ is applied across its p-n junction. Also shown in FIG. 3 are a laser temperature sensor 110 and a thermo-electric cooler (TEC) 114 coupled to the laser assembly 112. In some other embodiments, the laser temperature sensor and/or the TEC are integrated within the laser assembly 112. In yet other embodiments, the laser temperature sensor and/or the TEC are external to the TOSA 106.

In some embodiments, the laser temperature sensor 110 is a thermistor. Any other device suitable for measuring the temperature of the laser diode may also be used. As shown in FIG. 3, the laser temperature sensor 110 generates a signal ($V_{TL}$) that varies as a function of the temperature of the laser diode. As is well known to those skilled in the art, the wavelength of optical signals generated by a laser diode varies as a function of the temperature of the laser diode. Accordingly, in other embodiments, a sensor that measures the wavelength of the optical signals may be substituted for the laser temperature sensor 110. In still other embodiments, a device measuring an operating condition of the laser diode that varies as a function of the temperature of the laser diode is used instead of the laser temperature sensor 110.

The TEC 114 preferably includes two passive heat spreaders (one coupled to the laser assembly 112 and one coupled to the housing of the transceiver) and a plurality of thermoelectric elements that transfer heat to or from the laser assembly 112, depending on the direction of electric currents that are driven through the thermoelectric elements by a TEC driver 116. In a particular embodiment, the passive heat spreaders may be made of a ceramic material that includes beryllium oxide (BeO), and the thermoelectric elements may be made of a material that includes Bismuth Telluride ($Bi_2Te_3$).

With reference still to FIG. 3, laser driver circuitry 108 supplies both AC drive power and a positive DC bias current $I_{laser\ bias}$ to the laser assembly 112 to activate the laser emitter. Additionally, the laser driver circuitry 108 provides a voltage signal $V(I_{laser\ bias})$ that is proportional to the bias current $I_{laser\ bias}$ to the microprocessor 200. The microprocessor uses the $V(I_{laser\ bias})$ signal to correct for the effect of aging of the laser emitter. As is well known to those with skill in the art, the optical output of a laser emitter decreases as the laser ages, if the bias current $I_{laser\ bias}$ is held constant. It is desirable, however, for the optical output of a laser emitter to remain constant over time, and this may be accomplished by increasing the voltage $V(I_{laser\ bias})$ to compensate for the effect of laser aging. Since the bias current $I_{laser\ bias}$ is proportional to the voltage $V(I_{laser\ bias})$ an increase in $V(I_{laser\ bias})$ corresponds to an increase in the bias current $I_{laser\ bias}$. An increase in the bias current $I_{laser\ bias}$ in turn causes an increase in the temperature of the laser emitter, and hence in the wavelength of optical signals from the laser emitter. Thus, maintaining the optical output of the laser emitter at a constant level over time by increasing the bias current $I_{laser\ bias}$ would affect the wavelength of the optical signals from the laser emitter. The microprocessor 200 receives the $V(I_{laser\ bias})$ voltage signal to enable it to compensate for the effect of laser aging on the wavelength of the optical signals by adjusting the temperature of the laser emitter in response to changes in the bias current $I_{laser\ bias}$.

An additional input is provided to the microprocessor 200 by an ambient temperature sensor 120, which measures the ambient temperature surrounding the TOSA 106 and generates a signal ($V_{TA}$) for the microprocessor 200 that varies as a function of the ambient temperature. Although a laser temperature sensor 110 is preferably placed in the proximity of a laser emitter, the temperature reading from the laser temperature sensor 110 generally differs from the actual temperature of the laser emitter because the laser temperature sensor 110 is physically separated from the laser emitter. As a consequence, the temperature reading from the laser temperature sensor 110 and its signal $V_{TL}$ vary as a function of the outside temperature. By receiving the ambient temperature signal $V_{TA}$ the microprocessor 200 is able to compensate for the effect of the ambient temperature on the temperature reading from the laser temperature sensor.

Figure 4:
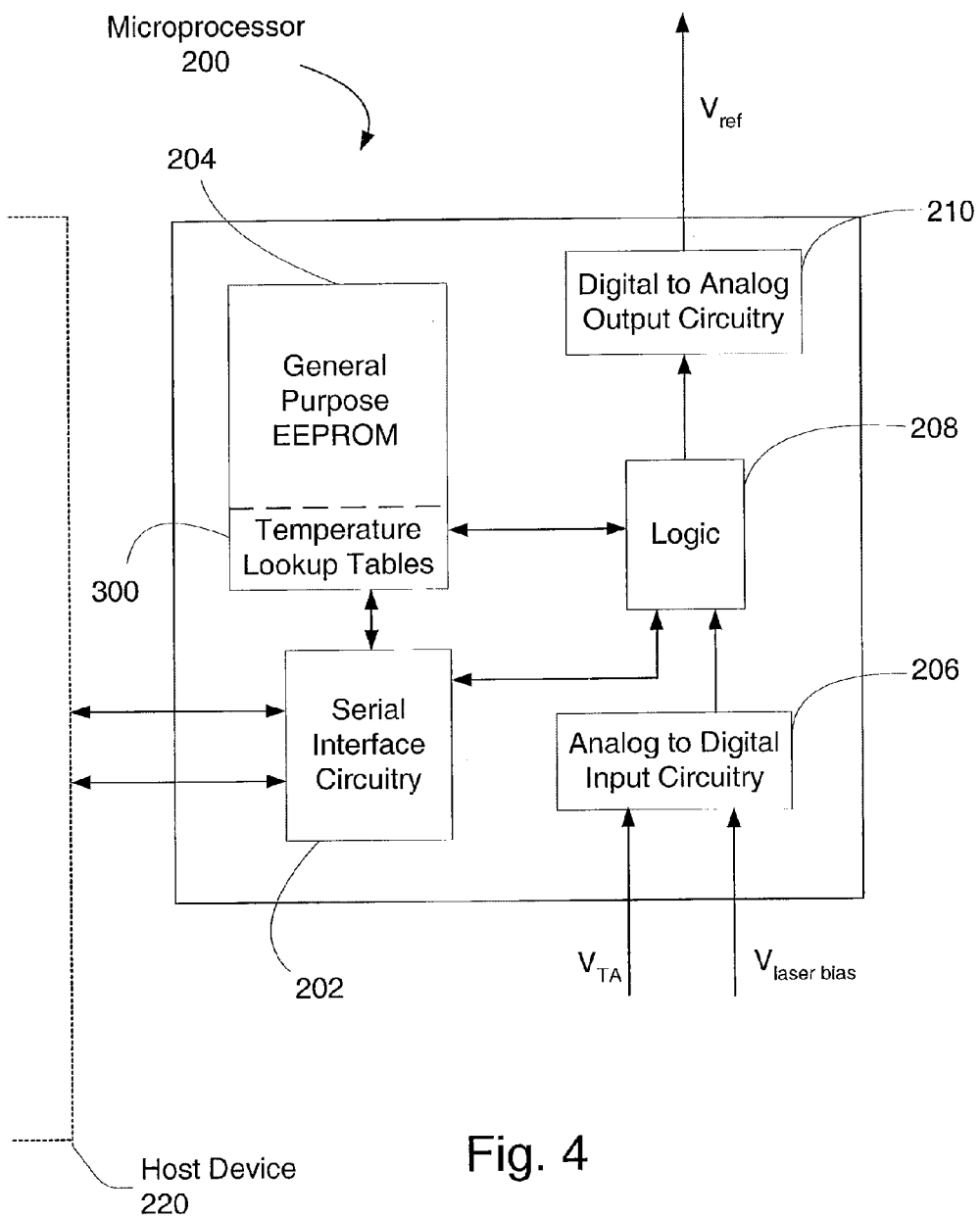
FIG. 4 is a block diagram depicting a portion of a circuit implementing the microprocessor of FIG. 3 in accordance with one embodiment of the present invention.

In addition to the $V(I_{laser\ bias})$ and $V_{TA}$ signals, the microprocessor 200 receives inputs from a host device 220 through serial interface circuitry 202 (FIG. 4). Using the information collected from the host device, the laser driver circuitry 108 and the ambient temperature sensor 120, the microprocessor 200 generates an analog reference voltage signal $V_{ref}$ to set the temperature of the laser emitter in the laser assembly 112. In particular, the microprocessor 200 generates a reference voltage signal $V_{ref}$ based on inputs of $V(I_{laser\ bias})$ from the laser driver circuitry 108, $V_{TA}$ from the ambient temperature sensor 120 and calibrated values previously stored within the microprocessor 200 during the calibration of the optoelectronic transceiver 100.

The reference voltage signal $V_{ref}$ generated by the microprocessor 200 is then transmitted to both the TEC controller circuitry 118 and TEC driver circuitry 116. The TEC controller circuitry 118 also receives a laser temperature signal $V_{TL}$ from the laser temperature sensor 110, and the TEC controller 118 is configured to generate a differential signal $V_{dif}$ that is proportional to the difference between the input signals it receives ($V_{TL}-V_{ref}$). The differential signal $V_{dif}$ from the TEC controller circuitry 118 is transmitted to the TEC driver circuitry 116, which also receives the reference voltage signal $V_{ref}$ generated by the microprocessor 200. The TEC driver circuitry 116 is configured to generate an output signal VTEC to drive the TEC 114 that is proportional to the difference between its input signals ($V_{dif}-V_{ref}$). Consequently, the TEC driver circuitry 116 will drive the TEC 114 based on $V_{TL}$ and the reference voltage signal $V_{ref}$ generated by the microprocessor 200.

FIG. 4 is a logical block diagram illustrating a portion of a circuit implementing the microprocessor 200 according to one embodiment of the present invention. The microprocessor 200 includes serial interface circuitry 202 coupled to host device interface input/output lines. In some embodiments, the serial interface circuitry 202 operates in accordance with the two wire serial interface standard that is also used in the GBIC (Gigabit Interface Converter) and SFP (Small Form Factor Pluggable) standards; however, other serial interfaces could equally well be used in alternate embodiments. In yet other embodiments, a multiple-pin interface could be used in place of a serial interface. The interface circuitry 202 is used for setup and querying of the microprocessor 200, and enables access to the optoelectronic transceiver 100 by a host device 220 connected thereto.

The microprocessor 200 also includes one or more volatile and/or nonvolatile memory devices, such as a general purpose EEPROM (electrically erasable and programmable read only memory) device 204, as shown in FIG. 2. Tables and parameters may be set up using the EEPROM device 204 by writing values to predefined memory locations in the memory devices, and various output values may be output by reading from predetermined memory locations in the memory devices.

Figure 5:
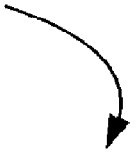
FIG. 5 is a diagram of a temperature lookup table in accordance with one embodiment of the present invention.

Included in the EEPROM device 204 are one or more lookup tables 300. An example of an ambient temperature lookup table 300 is shown in FIG. 5. Lookup tables may be used to assign values to control outputs as a function of inputs provided by various sensors. In the example shown in FIG. 5, various changes in the reference voltage values are assigned to various ambient temperatures. It should be understood that the values shown in FIG. 5 are provided only to illustrate the concept of a temperature lookup table, and while they are representative of typical values for an ambient temperature lookup table, they are not the actual values for a specific laser emitter and ambient temperature sensor. Alternatively, an ambient temperature lookup table may be used to map another control output (such as a pulse width or duty factor) to the ambient temperature of the optoelectronic transceiver 100. Additionally, other types of lookup tables may be used to map other types of output values of the microprocessor 200 to other inputs (such as the voltage $V(I_{laser\ bias})$ for the laser emitter).

In an embodiment of the invention, the microprocessor 200 uses two lookup tables, a baseline value for the reference voltage signal, $V_{set}$, stored in the EEPROM device 204, and the inputs of $V(I_{laser\ bias})$ from the laser driver circuitry 108 and $V_{TA}$ from the ambient temperature sensor 120 to generate the reference voltage signal $V_{ref}$. $V_{set}$ is the reference voltage value that is generated by the microprocessor 200 when the ambient temperature of the optoelectronic transceiver 100 is a predefined value, $T_{set}$, and the voltage $V(I_{laser\ bias})$ applied to the laser assembly is a predefined value, $V_{set\ laser\ bias}$. The microprocessor 200 uses the following formula to adjust the reference voltage signal to the appropriate value when the input signals for the voltage $V(I_{laser\ bias})$ and the ambient temperature $V_{TA}$ differ from the predefined values, $T_{set}$ and $V_{set\ laser\ bias}$: $V_{ref}=V_{set}+\Delta V_{ref}(V_{TA})+\Delta V_{ref}(V(I_{laser\ bias}))$. $\Delta V_{ref}(V_{TA})$ and $\Delta V_{ref}(V(I_{laser\ bias}))$ represent the changes in the reference voltage $V_{ref}$ as a function of $V_{TA}$, the signal from the ambient temperature sensor, and the voltage $V(I_{laser\ bias})$, respectively. $\Delta V_{ref}(V_{TA})$ is obtained from an ambient temperature table and compensates for the difference between the ambient temperature and the actual temperature of the laser emitter. Similarly, $\Delta V_{ref}(V(I_{laser\ bias}))$ is obtained from a voltage lookup table, and it compensates for the effect of laser aging. Each of the table lookups may be accomplished by selecting a closest or best entry in the corresponding table, or alternately may be accomplished by interpolating between two closest or best entries in the table.

Also as shown in FIG. 4, the microprocessor 200 includes analog to digital circuitry (A/D) 206 for receiving analog signals from other parts of the optoelectronic transceiver 100 and converting the analog signals to digital values, which may be processed by the digital control logic 208. The control logic 208 is configured to receive digital values from the A/D 206 as well as lookup tables, from the LEPROM 204 and from the host device 220 through the serial interface 202. In addition, the control logic 208 is configured to write selected digital values to predefined memory locations in the LEPROM 204 and output digital values to host devices when polled through the serial interface circuitry 202. Furthermore the control logic 208 is configured to determine $V_{ref}$ using the formula that is described above. In one embodiment, the control logic 208 is implemented by software instructions executable by the microprocessor 200. In this embodiment, the algorithm for determining $V_{ref}$ can be updated and modified by the users easily.

Lastly, as illustrated in FIG. 4, digital to analog output circuitry (D/A) 210 is provided to receive digital values from the control logic 208 and convert them into analog signals to regulate other parts of the optoelectronic transceiver 100.

Figure 6:
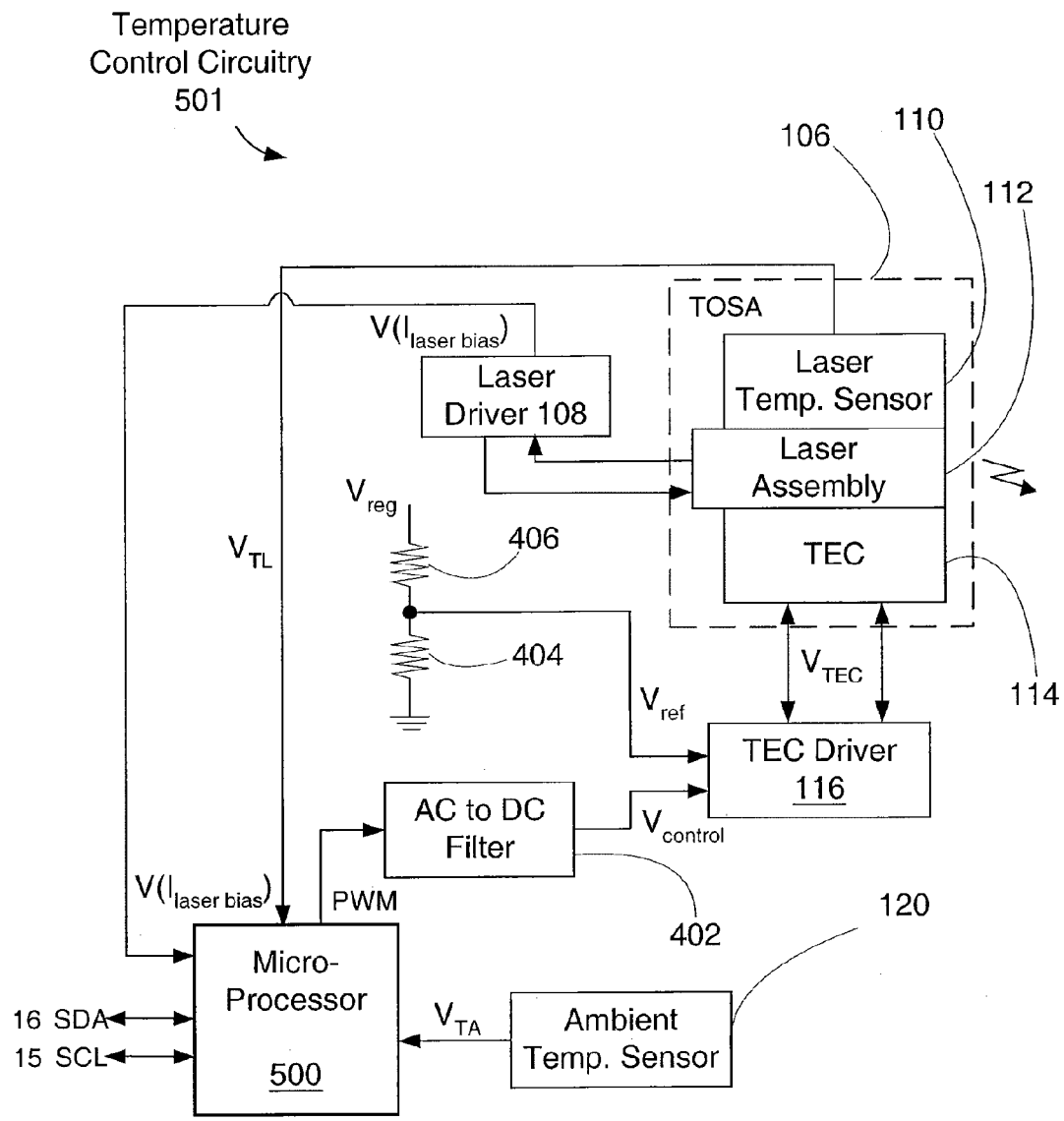
FIG. 6 is a block diagram illustrating circuitry for controlling the temperature of a laser emitter in accordance with another embodiment of the present invention.
Figure 7:
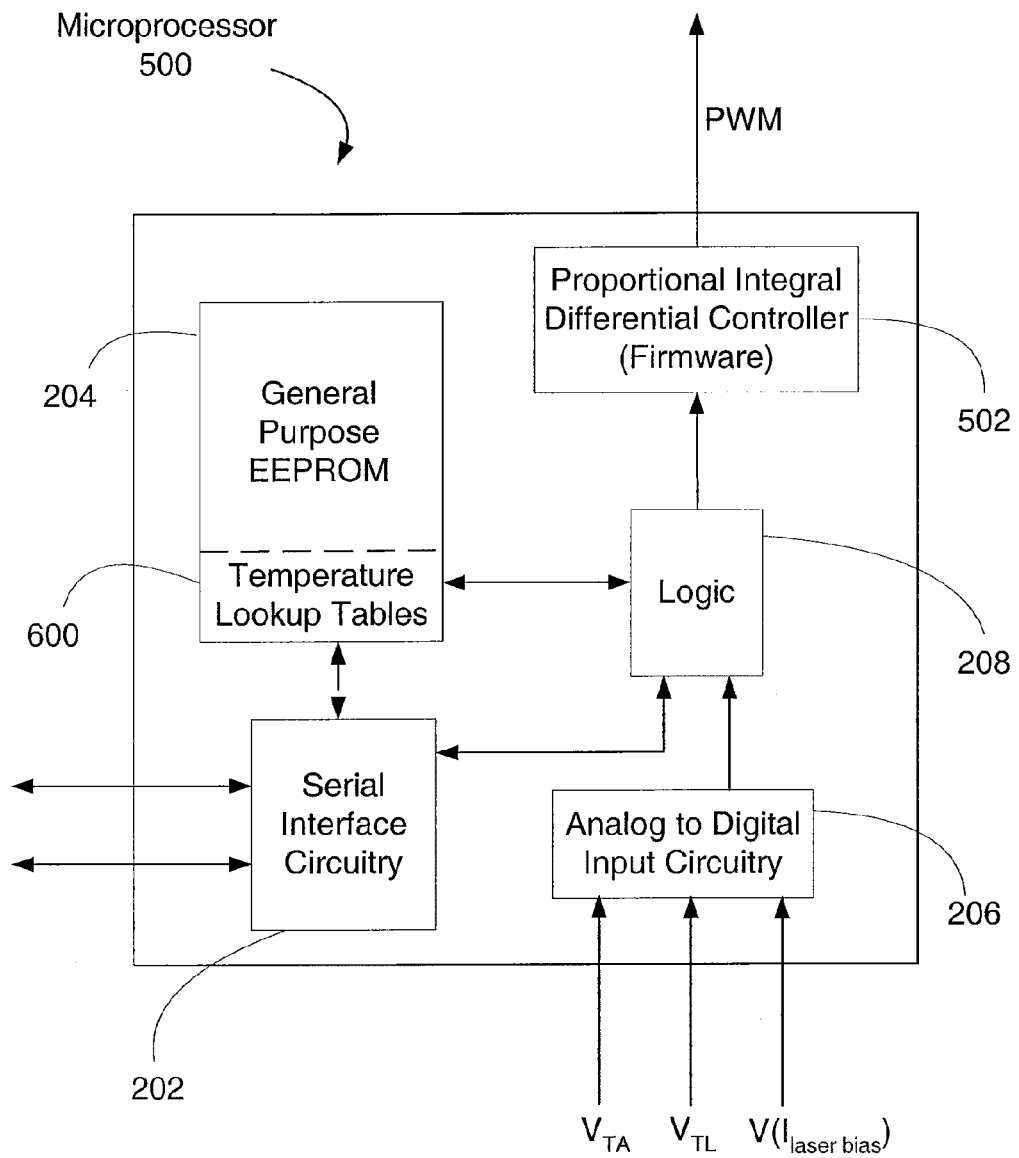
FIG. 7 is a block diagram depicting a portion of a circuit implementing the microprocessor of FIG. 6 in accordance with one embodiment of the present invention.
Figure 8:
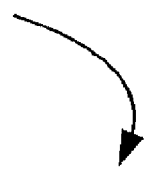
FIG. 8 is a diagram of a temperature lookup table for the microprocessor in FIG. 7.

FIGS. 6, 7 and 8 illustrate another embodiment of the present invention. As in the embodiment illustrated in FIGS. 3, 4 and 5, a laser assembly 112, a laser temperature sensor 110, and a TEC 114 are included in a TOSA 106. Also as in the embodiment illustrated in FIGS. 3,4 and 5, laser driver circuitry 108 supplies both AC drive power and the positive DC bias current $I_{laser\ bias}$ to the laser assembly 112, and the laser driver circuitry 108 also provides a $V(I_{laser\ bias})$ signal to the microprocessor 500. However, in contrast to the embodiment illustrated in FIGS. 3, 4 and 5, in the embodiment illustrated in FIGS. 6, 7 and 8, the output from the microprocessor 500 is a pulse width modulated signal. An AC to DC filter 402 converts the pulse width modulated signal to a filtered signal $V_{control}$, which is transmitted to the TEC driver 116. For some applications, the embodiment in FIGS. 6-8 may be preferable to the embodiment in FIGS. 3-5 because the filter 402 (FIG. 6) may take up less space and be cheaper than the analog circuitry required to implement TEC controller 118.

With reference still to FIGS. 6-8, the TEC driver 116 receives the filtered signal $V_{control}$ from the filter 402 and a pre-determined reference voltage $V_{ref}$ from a voltage divider formed by resistors 404 and 406. The TEC driver 116 compares $V_{control}$ to $V_{ref}$, and generates the appropriate control signals for driving the TEC 114.

Like the microprocessor 200 in FIG. 4, the microprocessor 500 for the embodiment depicted in FIG. 7 includes serial interface circuitry 202, a general purpose EEPROM 204, analog to digital circuitry 206, and control logic 208. A firmware implemented proportional integral differential controller (PIDC) 502 controls a pulse wave modulated (PWM) of the microprocessor 500.

FIG. 8 illustrates an ambient temperature lookup table 600 for the embodiment in FIGS. 6 and 7. It should be understood that like the values shown in FIG. 5, the values shown in FIG. 8 are provided only to illustrate the concept of a temperature lookup table, and while they are representative of typical values for an ambient temperature lookup table, they are not the actual values for a specific laser emitter and ambient temperature sensor. The ambient temperature lookup table 600 in FIG. 8 is configured differently than the ambient temperature lookup table 300 in FIG. 5 for the embodiment in FIGS. 3 and 4. Instead of reference voltage values ($V_{ref}$), the ambient temperature lookup table 600 for the embodiment in FIGS. 6, 7 and 8 provides duty factor values for various ambient temperatures.

The control logic 208 processes the duty factor values from the ambient temperature lookup table 600 with its other inputs to control the pulse wave modulated signal that is generated by the PIDC 502. In the embodiment of FIGS. 6, 7 and 8, the control logic 208 adjusts the pulse widths of the PWM signal from the PIDC 502 based on inputs of $V_{TL}$ from the laser temperature sensor 110, $V(I_{laser\ bias})$ from the laser driver circuitry 108, and $V_{TA}$ from the ambient temperature sensor 120, as well as from the duty factors stored in the ambient temperature lookup table 600 and a voltage lookup table, digital values stored in the LEPROM 204 and input from host devices through the serial interface circuitry 202. The microprocessor 200 uses the following formula to adjust the duty factor (DF) to the appropriate value when the input signals for $V_{TL}$, $V_{TA}$ and $V(I_{laser\ bias})$ differ from predefined values, $V_{setTL}$, $V_{setTA}$ and $V_{set\ laser\ bias}$: DF=$DF_{set}$+$\Delta DF(V_{TL})$+$\Delta DF(V_{TA})$+$\Delta DF(V(I_{laser\ bias}))$. $\Delta DF(V_{TL})$, $\Delta DF(V_{TA})$ and $\Delta DF(V(I_{laser\ bias}))$ represent the changes in the duty factor DF as a function of $V_{TL}$ (the signal from the laser temperature sensor), $V_{TA}$ (the signal from the ambient temperature sensor), and $V(I_{laser\ bias})$ (the voltage that corresponds to the bias current $I_{laser\ bias}$), respectively. $\Delta DF(V_{TL})$ is obtained from a laser temperature table and compensates for the difference between the measured temperature of the laser emitter and the temperature of the laser emitter when $DF_{set}$, the default value for the duty factor, was set. $\Delta DF(V_{TA})$ is obtained from an ambient temperature table and compensates for the difference between the ambient temperature and the actual temperature of the laser emitter. Similarly, $\Delta DF(V(I_{laser\ bias}))$ is obtained from a voltage lookup table, and compensates for the effect of laser aging.

Figure 9:
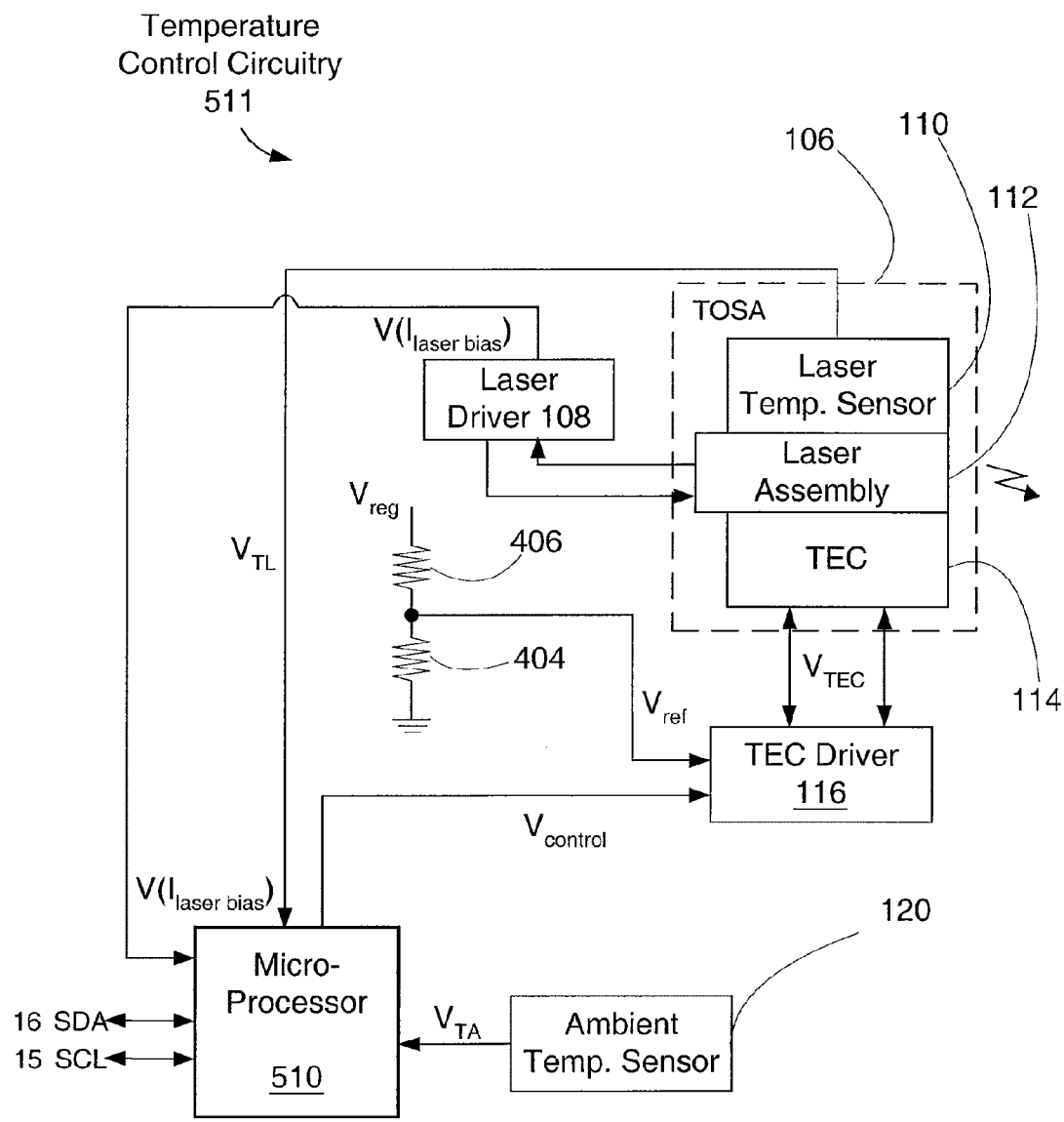
FIG. 9 is a block diagram illustrating circuitry for controlling the temperature of a laser emitter in accordance with yet another embodiment of the present invention.
Figure 10:
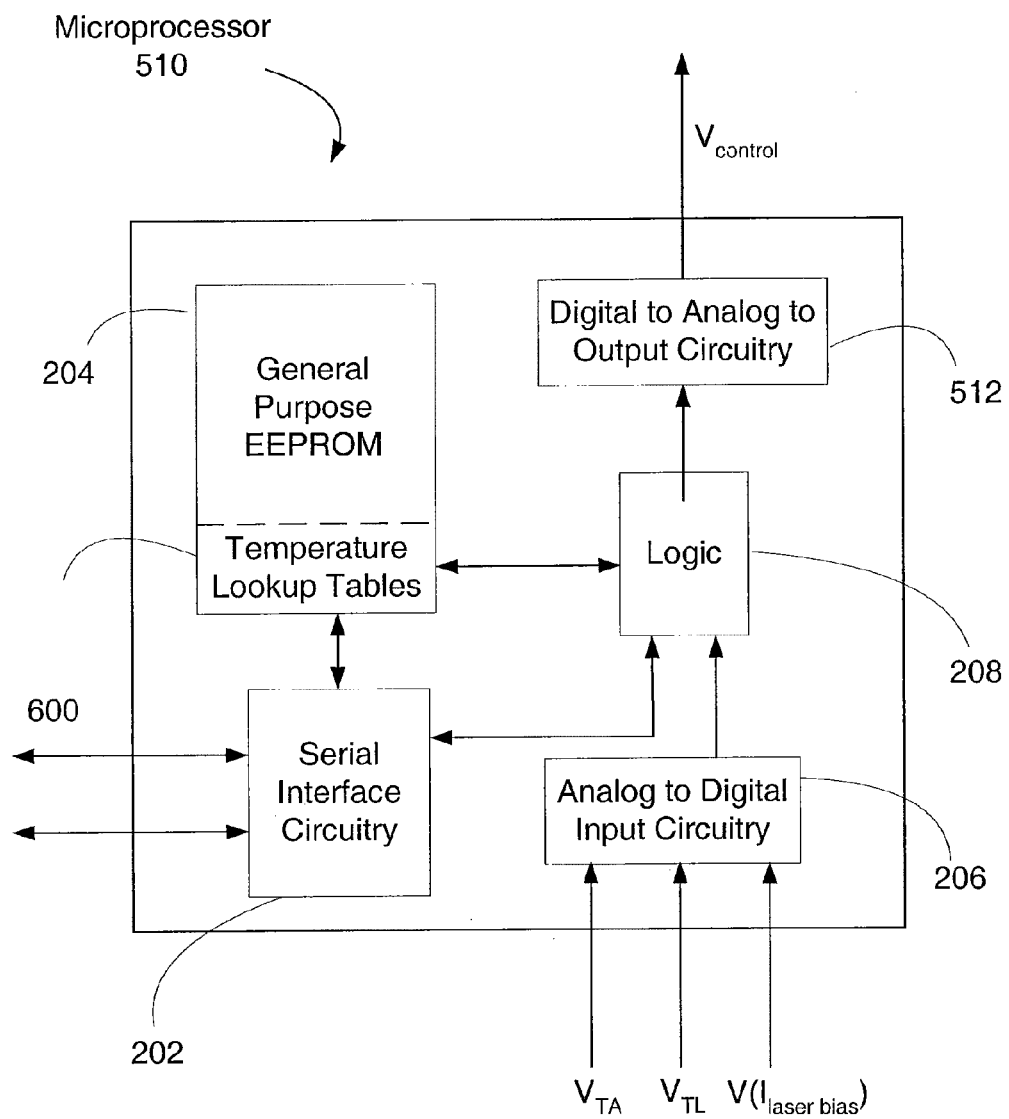
FIG. 10 is a block diagram depicting a portion of a circuit implementing the microprocessor of FIG. 9 in accordance with one embodiment of the present invention.

FIGS. 9 and 10 illustrate yet another embodiment of the present invention. In the embodiment shown in FIGS. 9 and 10, the microprocessor 510 generates an analog control voltage signal $V_{control}$ for the TEC driver 116, instead of generating a pulse width modulated signal that is then filtered by the AC to DC filter 402 to produce a filtered signal $V_{control}$. The temperature control circuitry 511 in FIG. 9 is identical to the temperature control circuitry 501 in FIG. 6, except that the AC to DC filter 402 in FIG. 6 is eliminated. The microprocessor 510 in FIG. 10 is identical to the microprocessor 500 in FIG. 7, except that the PIDC 502 in FIG. 7 is replaced with digital to analog output circuitry 512, which generates the analog control voltage signal $V_{control}$ for the TEC driver 116.

Figure 11:
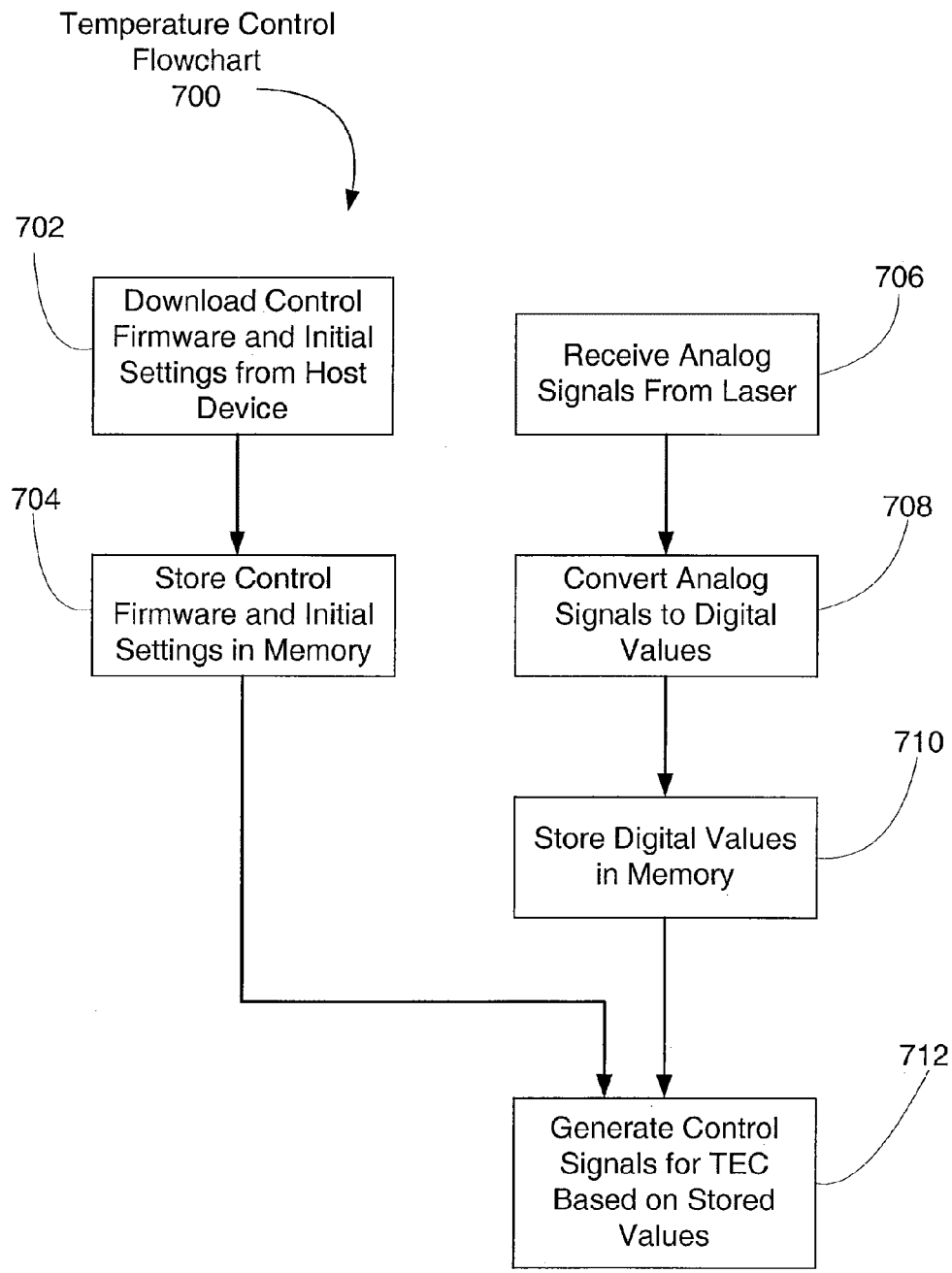
FIG. 11 is a flowchart depicting process steps for controlling the temperature of a laser emitter in accordance with an embodiment of the present invention.

FIG. 11 is a flowchart for controlling the temperature of laser emitters using a microprocessor 500 in accordance with embodiments of the present invention. In step 702 control firmware and initial settings are downloaded from a host device, such as a computer, preferably through serial interface circuitry 202. The control signals include data relating to laser aging and the effect of ambient temperatures on the wavelength of optical signals from a laser emitter, and they may be transmitted to the microprocessor 200 in the optoelectronic transceiver 100 during calibration of the optoelectronic transceiver, as described below in the discussion of FIGS. 12 and 13. The control commands and signals are stored in the EEPROM 204 in step 704. The receipt and storage of control commands and signals in steps 702 and 704 may be accomplished prior to operation of the laser emitter, or while the laser emitter is operating. During operation of the laser emitter, analog signals representing a variety of operating conditions of the laser emitter, including its temperature, the voltage corresponding to the laser bias current, and the ambient temperature surrounding the laser emitter, are generated and received by a microprocessor 200 in step 706. The analog signals are converted to digital values in step 708 and stored in the EEPROM 204 of the microprocessor 200 in step 710. Lastly, in step 712 the microprocessor 200 generates control signals for the temperature control mechanism, which preferably include a TEC 114 and a TEC driver 116, based on the control signals and digital values that have been stored in the EEPROM 204 of the microprocessor 200 during the preceding steps.

Figure 12:
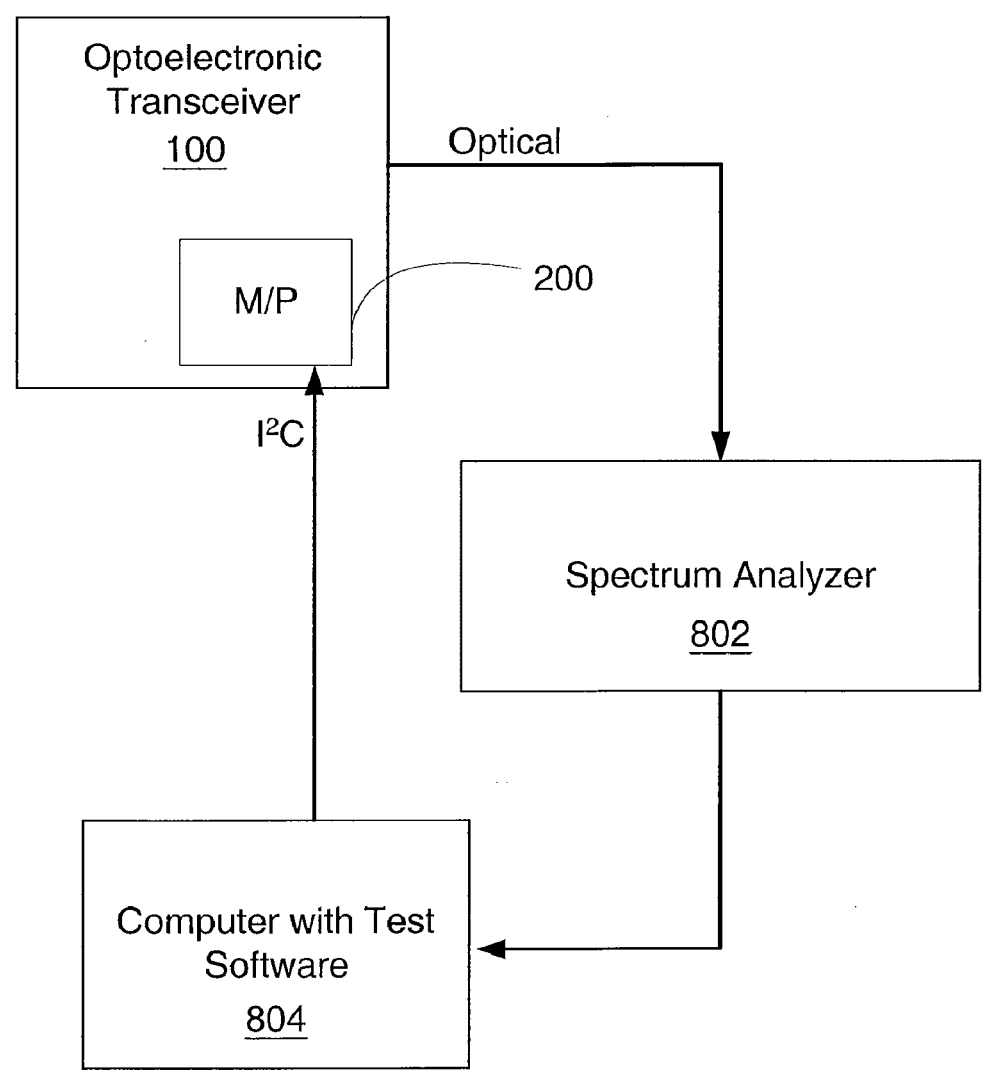
FIG. 12 is a diagram of a setup and tuning system in accordance with one embodiment of the present invention.

FIG. 12 is a logical block diagram illustrating a system for setup and tuning of an optoelectronic assembly in accordance with another aspect of the present invention. In applications using Dense Wavelength Division Multiplexing (DWDM), laser emitters must be tuned to transmit optical signals having wavelengths that correspond to specified International Telephone Union (ITU) channels. The spacing of the ITU channels for DWDM at 100 GHz is 0.8 nm±0.1 nm. For 200 GHz, the spacing is 1.6 nm±0.2 nm, and for 50 GHz, the spacing is 0.4 nm±0.05 nm. Laser diodes that are commercially available generally include specification data on the wavelength of optical signals the laser diodes emit while operating at room temperature. However, it is desirable to operate laser diodes used in optoelectronic assemblies above the ambient temperature.

Operating laser diodes above the ambient temperature allows the TEC's 114 to function more efficiently because the TEC's are heating the laser diodes more often than they are cooling them. TEC's are more efficient when heating than cooling, because the thermoelectric effect and resistive heating are working together when a TEC 114 is heating a laser assembly 112, rather than opposing one another as is the case when a TEC 114 is cooling the laser assembly 112. Efficiency is of particular importance in pluggable transceiver applications, where the available power is limited to specified levels. On the other hand, operating laser diodes at high temperatures may shorten their useful life.

It is therefore preferable for many applications to tune a laser diode by adjusting $V_{ref}$ (in the embodiments of FIGS. 3, 4 and 5) or $V_{control}$ (in the embodiments of FIGS. 6, 7 and 8) so that the laser diode emits optical signals that fall within a desired ITU channel wavelength for a selected DWDM frequency when the operating temperature of the laser diode is as high as possible, but not more than 55 C. The system and method illustrated in FIGS. 10 and 11 may be used to accomplish this objective.

With reference to FIG. 12, an optoelectronic transceiver 100 is coupled to transmit optical signals to a spectrum analyzer 802. The spectrum analyzer 802 measures the wavelength of the optical signals and provides the wavelength to a computer 804 with test software. The computer 804 sends signals to the optoelectronic transceiver 100 through a serial interface using the two wire serial interface standard to adjust the temperature of the laser emitter until the wavelength for a selected ITU channel is reached. Changing the temperature of a distributed feedback laser diode, for example, by 1° C. generally results in a change of approximately 0.1 nm in the wavelength of the optical signals it emits.

First, the computer causes the microprocessor to adjust the reference voltage $V_{ref}$ until the signal from the laser temperature sensor 110 indicates that the laser's temperature is 55° C. The reference voltage $V_{ref}$ is then reduced until the spectrum analyzer 802 indicates that the wavelength of the optical signals has been tuned to the first ITU channel below a 55° C. operating temperature for the laser diode. The computer 804 causes this reference voltage value, $V_{set}$, to be stored in the EEPROM 204 of the microprocessor 200 in the optoelectronic transceiver 100. At the time that $V_{set}$ is determined, the ambient temperature of the optoelectronic transceiver 100 is at a predefined value, $T_{set}$, and the bias current $I_{laser\ bias}$ for the laser assembly is at a predefined value, $V_{set\ laser\ bias}$.

After $V_{set}$ has been determined for the predefined ambient temperature $T_{set}$ and the predefined voltage $V_{set\ laser\ bias}$, the ambient temperature is varied and the control value for the temperature control circuitry adjusted so that the laser emitter is tuned to the appropriate wavelength in order for the computer 804 to produce entries in an ambient temperature lookup table. In some embodiments of the present invention the control value is the reference voltage value $V_{ref}$, and in other embodiments the control value is $V_{control}$. The ambient temperature table is then stored in the EEPROM 204 of the microprocessor in the optoelectronic transceiver 100. After the optoelectronic transceiver is calibrated, the control logic in the microprocessor uses the ambient temperature lookup table to compensate for the effect of ambient temperature on the wavelength of optical signals from the laser emitter. Similarly, the voltage $V(I_{laser\ bias})$ may be varied from its baseline value $V_{set\ laser\ bias}$, and the reference voltage value $V_{ref}$ adjusted until the laser emitter is tuned to the appropriate wavelength in order for the computer 804 to produce entries in a voltage lookup table, The control logic in the microprocessor of the optoelectronic transceiver may then use the voltage lookup table to compensate for aging of the laser emitter.

Figure 13:
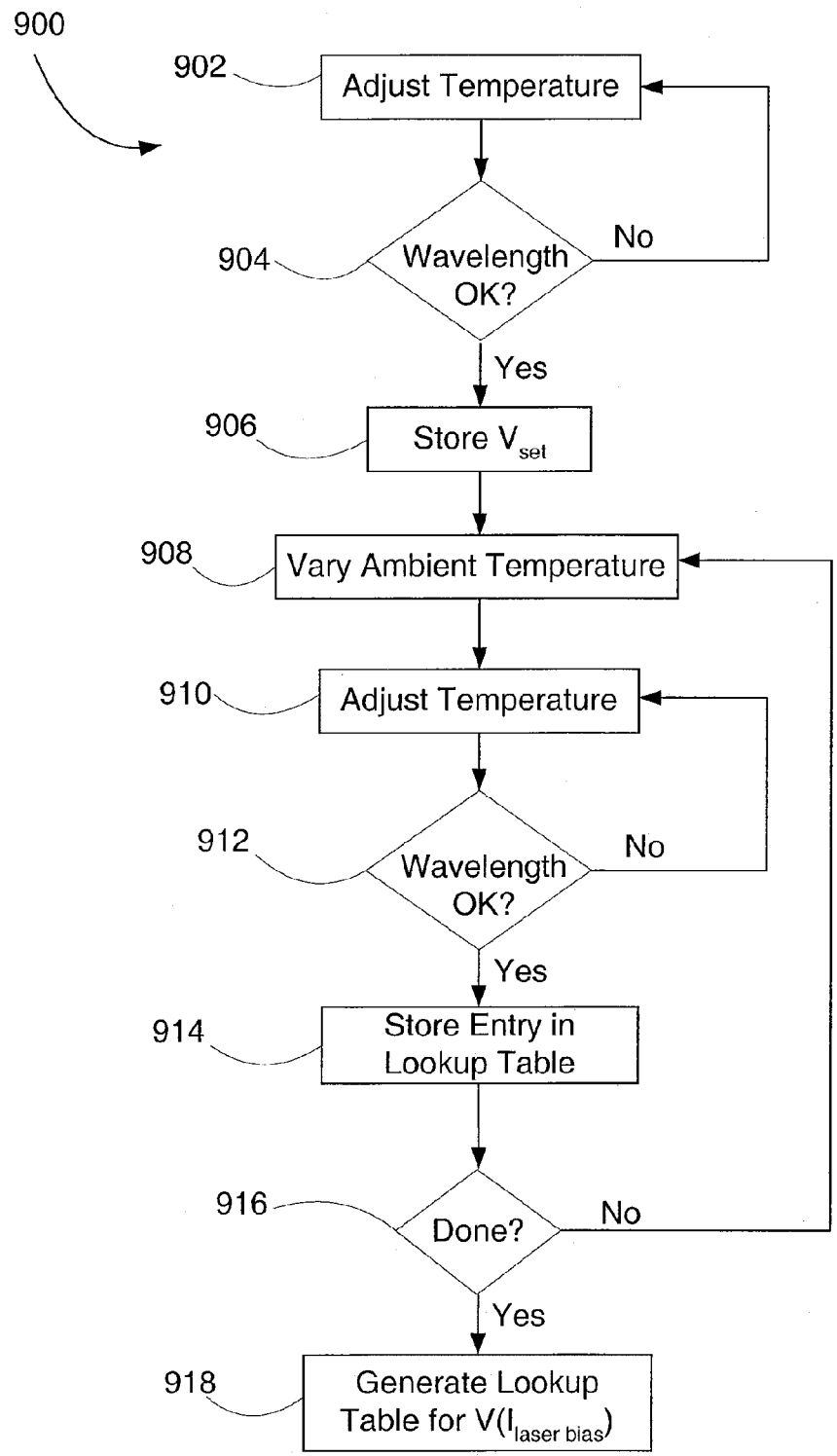
FIG. 13 is a flowchart depicting process steps for calibrating a laser emitter in accordance with an embodiment of the present invention.

FIG. 13 is a flowchart for calibrating an optoelectronic transceiver 100 in accordance with embodiments of the present invention. Initially the ambient temperature and voltage $V(I_{laser\ bias})$ corresponding to the laser bias current are set to predefined values $T_{set}$ and $V_{set}$ laser bias. The temperature of the laser emitter is adjusted in step 902 by varying the reference voltage $V_{ref}$, and the wavelength of the optical signals from the laser emitter is monitored in step 904 until the temperature of the laser emitter is as high as possible, but less than 55° C., and the wavelength is within an ITU channel. Once these conditions are satisfied, the baseline reference voltage value $V_{set}$ is stored in the EEPROM 204 of the microprocessor in the optoelectronic transceiver 100 in step 906. In step 908 the ambient temperature of the optoelectronic transceiver is changed to another value. Then in step 910 the temperature of the laser emitter is again adjusted by varying the reference voltage $V_{ref}$. In step 912 the wavelength of the optical signals from the laser emitter is monitored in step 904 until the wavelength is within a selected ITU channel. The change in the reference voltage $V_{ref}$ and the ambient temperature are recorded as an entry in an ambient temperature lookup table in step 914. This process is repeated for other ambient temperatures until the ambient temperature table is completed in step 916.

A voltage table is generated in step 918 by following a similar procedure. The voltage $V(I_{laser\ bias})$ is varied from $V_{set}$ laser bias and the temperature of the laser emitter is adjusted by varying the reference voltage $V_{ref}$. The wavelength of the optical signals is again monitored until it is within the ITU channel, and then the change in the reference voltage $V_{ref}$ and the voltage $V(I_{laser\ bias})$ are recorded as an entry in the voltage lookup table. This procedure is repeated for different voltages to generate the voltage lookup table.

The description of the system and method for calibrating an optoelectronic transceiver that appears above is for embodiments illustrated in FIGS. 3, 4 and 5 in which the microprocessor sets the temperature of the laser emitter by regulating $V_{ref}$. Persons with skill in the art having the benefit of this disclosure will recognize that an analogous system and method may be implemented for the embodiments illustrated in FIGS. 6-10 in which the microprocessor sets the temperature of the laser emitter by regulating $V_{control}$.

The foregoing descriptions of specific embodiments of the present invention are presented for purposes of illustration and description. The embodiments were chosen and described in order to best explain the principles of the invention and its practical applications, to thereby enable others skilled in the art to best utilize the invention. They are not intended to be exhaustive or to limit the invention to the precise forms disclosed. Various modifications may occur to those skilled in the art having the benefit of this disclosure without departing from the inventive concepts described herein. Accordingly, it is the claims, not merely the foregoing illustration, that are intended to define the exclusive rights of the invention.

What is claimed is:

1. Temperature control circuitry for a laser emitter disposed within a housing of an optoelectronic assembly, the temperature control circuitry comprising an integrated circuit disposed within the housing, wherein the integrated circuit includes:
   logic configured to determine a reference voltage value associated with a target temperature for the laser emitter; and
   digital to analog circuitry to convert the reference voltage value to a reference voltage and provide the reference voltage to a temperature control mechanism to set temperature of the laser emitter to the target temperature.

2. The temperature control circuitry of claim 1, wherein the logic determines the reference voltage value based at least in part on:
   an ambient temperature of the optoelectronic assembly; and
   one or more entries in a lookup table in a memory of the integrated circuit.

3. The temperature control circuitry of claim 1, wherein the logic determines the reference voltage value based at least in part on:
   a bias current applied to the laser emitter by a laser driver; and
   one or more entries in a lookup table in a memory of the integrated circuit.

4. The temperature control circuitry of claim 1, wherein the logic determines the reference voltage value based at least in part on:
   an ambient temperature of the optoelectronic assembly;
   a bias current applied to the laser emitter by a laser driver; and
   one or more entries in lookup tables in a memory of the integrated circuit.

5. The temperature control circuitry of claim 1, wherein the logic determines the reference voltage value based at least in part on a baseline value stored in a memory of the integrated circuit.

6. The temperature control circuitry of claim 2, wherein the logic determines the reference voltage value by retrieving a baseline value from a memory, looking up an adjustment value in the lookup table based on the ambient temperature, and summing the baseline value with the adjustment value.

7. The temperature control circuitry of claim 3, wherein the logic determines the reference voltage value by retrieving a baseline value from a memory, looking up an adjustment value in the lookup table based on the bias current, and summing the baseline value with the adjustment value.

8. The temperature control circuitry of claim 4, wherein the logic determines the reference voltage value by retrieving a baseline value from a memory, looking up a first adjustment value in a first one of the lookup tables based on the ambient temperature, looking up a second adjustment value in a second one of the lookup tables based on the bias current temperature, and summing the baseline value with the first and second adjustment values.

9. The temperature control circuitry of claim 1, further comprising an interface to receive communications from an external host device, wherein the logic is configured to determine the reference voltage value using an algorithm received from the host device over the interface.

* * * * *

UNITED STATES PATENT AND TRADEMARK OFFICE
CERTIFICATE OF CORRECTION

| | | |
|---|---|---|
| PATENT NO. | : 7,680,160 B2 | Page 1 of 2 |
| APPLICATION NO. | : 11/851316 | |
| DATED | : March 16, 2010 | |
| INVENTOR(S) | : Stewart et al. | |

It is certified that error appears in the above-identified patent and that said Letters Patent is hereby corrected as shown below:

Title Page, Item (56), Col. 2, References Cited
Line 1, change "Simons" to --Simons et al.--

Figure 1:
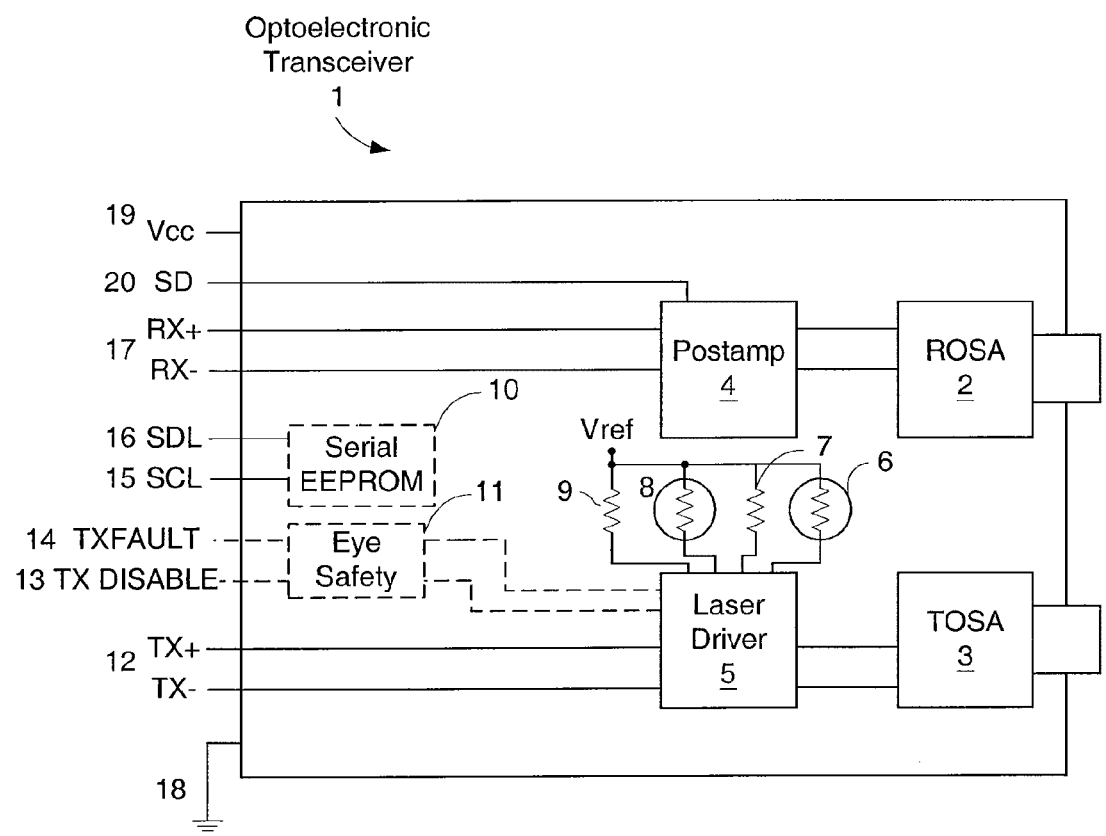
FIG. 1 is a block diagram of a prior art optoelectronic transceiver.

Drawings
Sheet 1, replace Figure 1 with the figure depicted below, wherein "SDL" has been changed to --SDA--

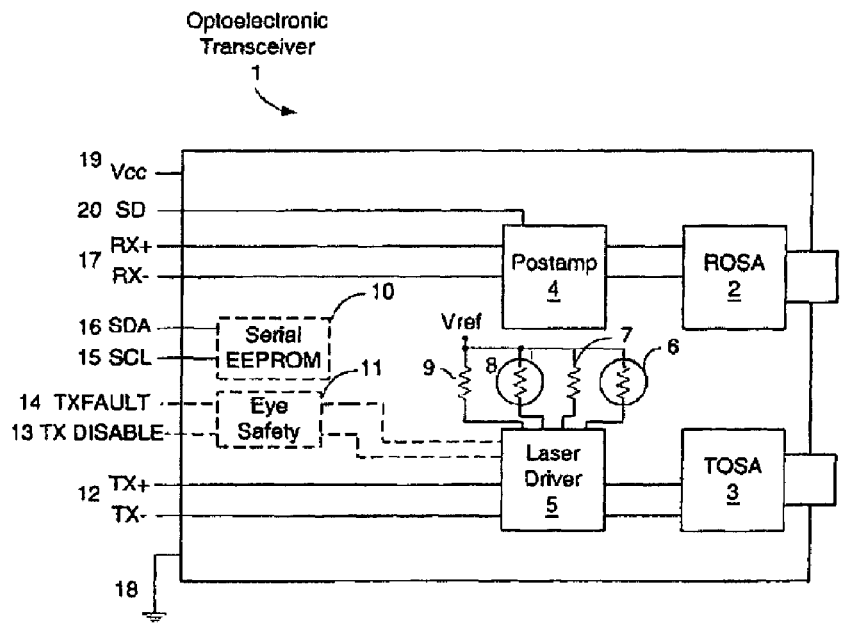

(Prior Art)

Fig. 1

Signed and Sealed this
Twenty-second Day of March, 2011

David J. Kappos
*Director of the United States Patent and Trademark Office*

CERTIFICATE OF CORRECTION (continued)

Column 1
Line 63, change "and TX fault" to --and the TX fault--

Column 2
Line 19, change "itself It" to --itself. It--

Column 4
Line 50, change "6.5 cm or less, and height" to --6.5 cm or less; and height--

Column 5
Line 14, change "temperature 30 of" to --temperature of--

Column 7
Line 57, change "$V_{TL}$" to --$V_{dif}$--

Column 8
Line 11, change "FIG. 2" to --FIG. 4--

Column 9
Line 2, change "LEPROM 204" to --EEPROM 204--
Lines 5-6, change "LEPROM 204" to --EEPROM 204--
Line 26, change "microprocessor 500" to --microprocessor 200--

Column 10
Line 6, change "LEPROM 204" to --EEPROM 204--
Line 8, change "microprocessor 200" to --microprocessor 500--
Line 37, change "FIG. 6" to --FIG. 9--

Column 11
Lines 20-22, change "TEC's" to --TECs--
Line 37, change "55 C" to --55°C.--

Column 12
Line 17, change "table, The" to --table. The--